United States Patent
Suzuki

[19]

[11] Patent Number: 5,977,590
[45] Date of Patent: Nov. 2, 1999

[54] SEMICONDUCTOR DEVICE HAVING INSULATION GATE TYPE FIELD EFFECT TRANSISTOR OF HIGH BREAKDOWN VOLTAGE

[75] Inventor: Seiji Suzuki, Hyogo, Japan

[73] Assignee: Mitsubishi Denki Kabushiki Kaisha, Tokyo, Japan

[21] Appl. No.: 09/113,146

[22] Filed: Jul. 10, 1998

[30] Foreign Application Priority Data

Jan. 14, 1998 [JP] Japan .................................. 10-005494

[51] Int. Cl.⁶ .................................................. H01L 29/76
[52] U.S. Cl. .......................... 257/339; 257/345; 257/375; 257/397; 257/398; 257/404
[58] Field of Search ...................... 257/339, 345, 257/404, 409, 355, 375, 396, 397, 398, 374

[56] References Cited

U.S. PATENT DOCUMENTS

| | | | |
|---|---|---|---|
| 4,700,212 | 10/1987 | Okazawa | 357/41 |
| 4,890,146 | 12/1989 | Williams et al. | 357/23.8 |
| 5,355,011 | 10/1994 | Takata | 29/76 |
| 5,495,124 | 2/1996 | Terashima | 257/550 |
| 5,623,154 | 4/1997 | Murakami et al. | 257/345 |

FOREIGN PATENT DOCUMENTS

| | | |
|---|---|---|
| 63-227046 | 9/1988 | Japan . |
| 2-214114 | 8/1990 | Japan . |
| 6-140503 | 5/1994 | Japan . |
| 6-163844 | 6/1994 | Japan . |
| 8-70052 | 3/1996 | Japan . |

*Primary Examiner*—William Mintel
*Attorney, Agent, or Firm*—McDermott, Will & Emery

[57] ABSTRACT

An n⁻ well region is formed at a surface of a semiconductor substrate. A MOS transistor of high breakdown voltage having a drain region and a source region is formed at the surface of the n⁻ well region. The n⁻ well region has an impurity concentration peak right below the drain region. Accordingly, a semiconductor device having a high breakdown voltage insulation gate type field effect transistor that can suppress increase of a depletion layer when high voltage is applied across the drain, that can reduce the electric field intensity across the drain, and that has superior breakdown voltage, and a fabrication method thereof, are obtained.

5 Claims, 7 Drawing Sheets

SEMICONDUCTOR DEVICE HAVING INSULATION GATE TYPE FIELD EFFECT TRANSISTOR OF HIGH BREAKDOWN VOLTAGE

BACKGROUND OF THE INVENTION

1. Field of the Invention

The present invention relates to a semiconductor device having an insulation gate type field effect transistor of high breakdown voltage, and a method of fabricating such a semiconductor device.

2. Description of the Background Art

A semiconductor device having a MOS (Metal Oxide Semiconductor) transistor of high breakdown voltage will first be described as a conventional insulation gate type field effect transistor of high breakdown voltage.

Figure 8:
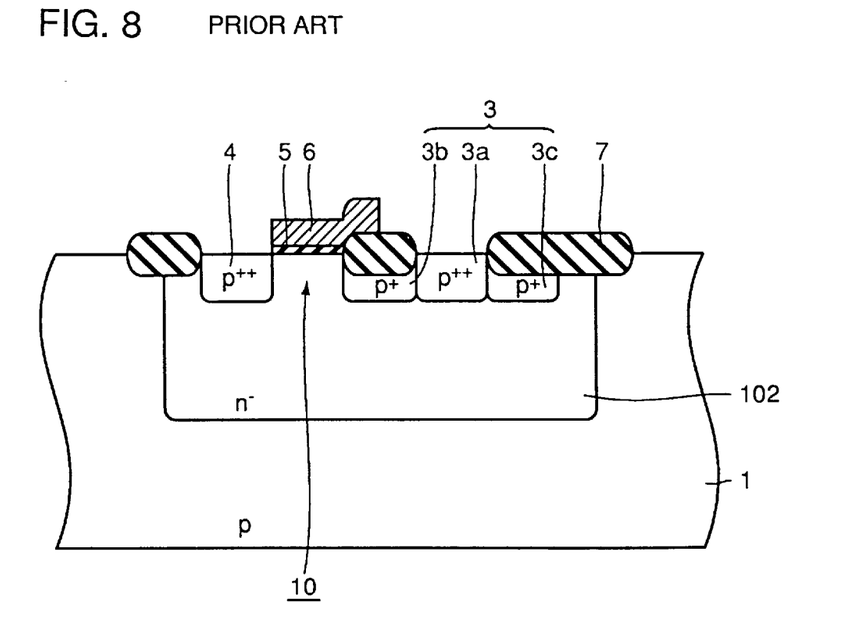
FIG. 8 is a sectional view schematically showing a structure of a semiconductor device having a conventional high breakdown voltage MOS transistor.

FIG. 8 is a sectional view schematically showing a structure of a semiconductor device having a conventional MOS transistor of high breakdown voltage. Referring to FIG. 8, an n⁻ well region 102 is formed at a surface of a p type substrate 1. A MOS transistor 10 of high breakdown voltage is formed at the surface of silicon substrate 1 in n⁻ well region 102.

High breakdown voltage MOS transistor 10 includes a drain region 3, a source region 4, a gate insulation layer (silicon oxide film) 5, and a gate electrode layer 6. Drain region 3 and source region 4 are formed at the surface of n⁻ well region 102 with a distance therebetween. Gate electrode layer 6 is formed on the region sandwiched by drain region 3 and source region 4 with gate insulation layer 5 thereunder.

Drain region 3 includes a p⁺⁺ region 3a, a p⁺ region 3b in contact with p⁺⁺ region 3a at the side of source region 4, and a p⁺ region 3c in contact with p⁺⁺ region 3a at the side opposite to source region 4. This p⁺⁺ region 3a has an impurity concentration substantially equal to that of source region 4. P⁺ regions 3b and 3c have an impurity concentration lower than that of source region 4.

A field insulation layer 7 is formed on p⁺ region 3b. The end portion of gate electrode layer 6 extends upon field insulation layer 7. Field insulating layer 7 is formed to enclose the circumference of high breakdown voltage MOS transistor 10 to electrically isolate MOS transistor 10 from other elements.

Figure 9:
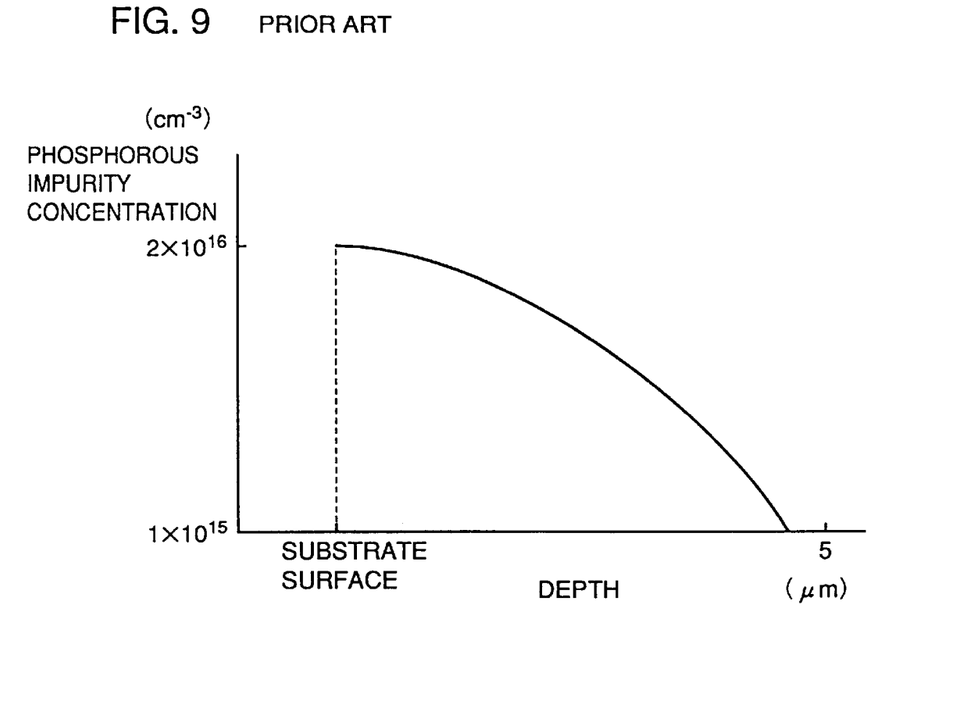
FIG. 9 shows an impurity concentration distribution of a conventional n⁻ well region.

In this conventional structure, n⁻ well region 102 has a P (phosphorous) impurity concentration distribution as shown in FIG. 9. Referring to FIG. 9, the P (phosphorous) impurity concentration is highest at the surface of the substrate, i.e., $2 \times 10^{16}$ (atoms/cm³). The impurity concentration becomes lower as a function of depth into the substrate. The P (phosphorous) impurity concentration becomes equal to the B (Boron) concentration ($1.0 \times 10^{15}$ (atoms/cm³)) of a 10 (Ω·cm) p type silicon substrate, whereby a pn junction is formed at the depth of approximately 5 μm.

A method of fabricating a semiconductor device having a conventional MOS transistor of high breakdown voltage will be described hereinafter.

Figure 10:
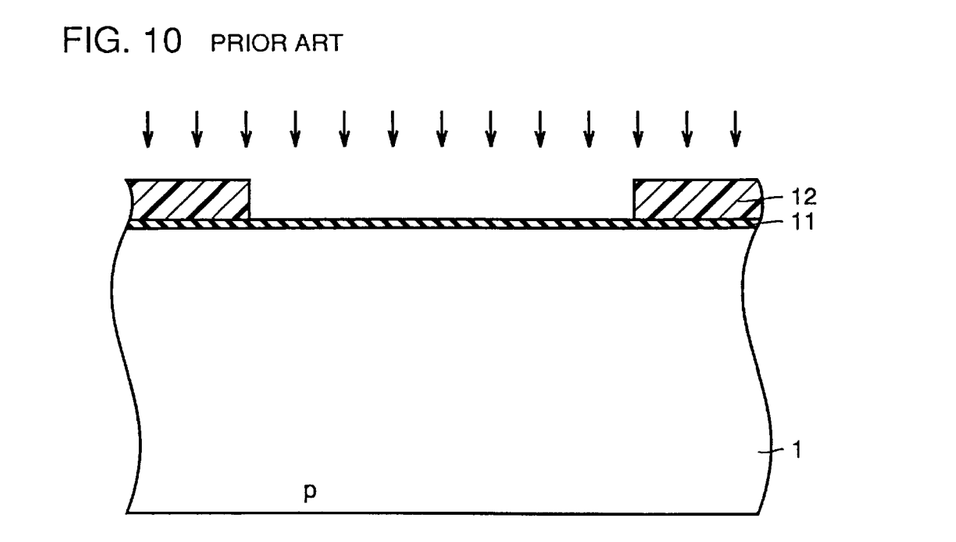
FIGS. 10–12 are sectional views of a semiconductor device having a conventional high breakdown voltage MOS transistor, corresponding to sequential steps of the fabrication process thereof.
Figure 11:
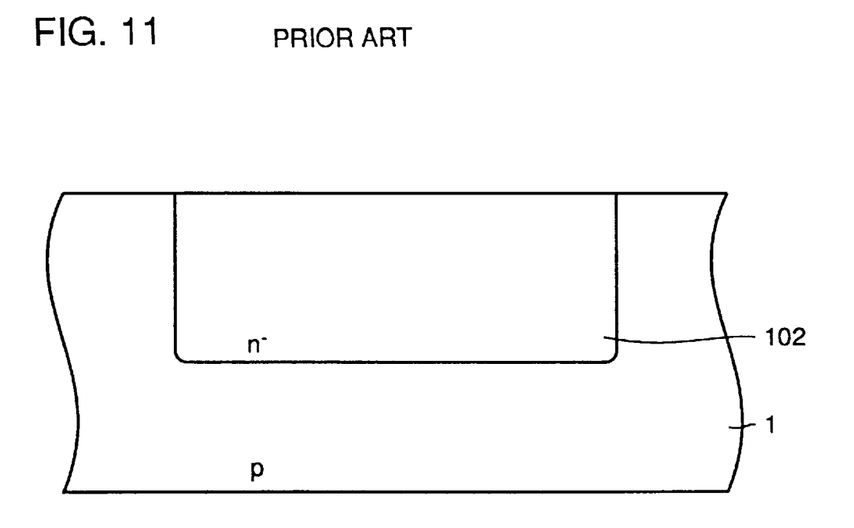
Figure 12:
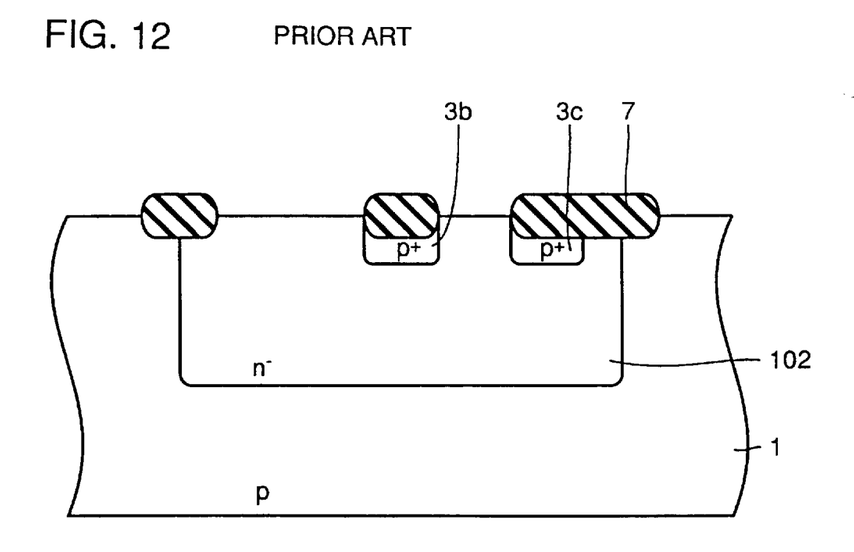

FIGS. 10–12 are sectional views of such a semiconductor device corresponding to sequential steps of a fabrication method thereof. Referring to FIG. 10, a silicon oxide film 11, for example, is formed on p type silicon substrate 1. A resist pattern 12 of a predetermined configuration is formed on silicon oxide film 11 by a conventional photolithographic technique. Using this resist pattern 12 as a mask, P (phosphorous) ions are implanted under the condition of 150 (keV) and $5.0 \times 10^{12}$ (cm⁻²). Following removal of resist pattern 12, a heat treatment is applied at 1200° C. for 360 minutes to diffuse and activate the impurities. Then, silicon oxide film 11 is removed.

Referring to FIG. 11, n⁻ well region 102 having the impurity concentration peak in the proximity of the surface is formed at the surface of p type silicon substrate 1 by the above heat treatment.

Referring to FIG. 12, field insulation layer 7, and p⁺ regions 3b and 3c under field insulation layer 7, are formed at the surface of p type silicon substrate 1.

Then, following formation of gate insulation layer 5 and gate electrode layer 6 shown in FIG. 8, p⁺ regions 3a and 4 are formed by ion implantation. Thus, a MOS transistor 10 of high breakdown voltage is formed at the surface of n⁻ well region 102.

Such a high breakdown voltage MOS transistor 10 is used for the driver of a fluorescent character display tube, for example. Recently, the demand for a clearer display is great. The need arises for a driver MOS transistor 10 of higher breakdown voltage.

However, the problem is that it is difficult to improve the breakdown voltage of MOS transistor 10 according to the impurity concentration distribution of the conventional n⁻ well region 102. This will be described in details hereinafter.

Figure 13:
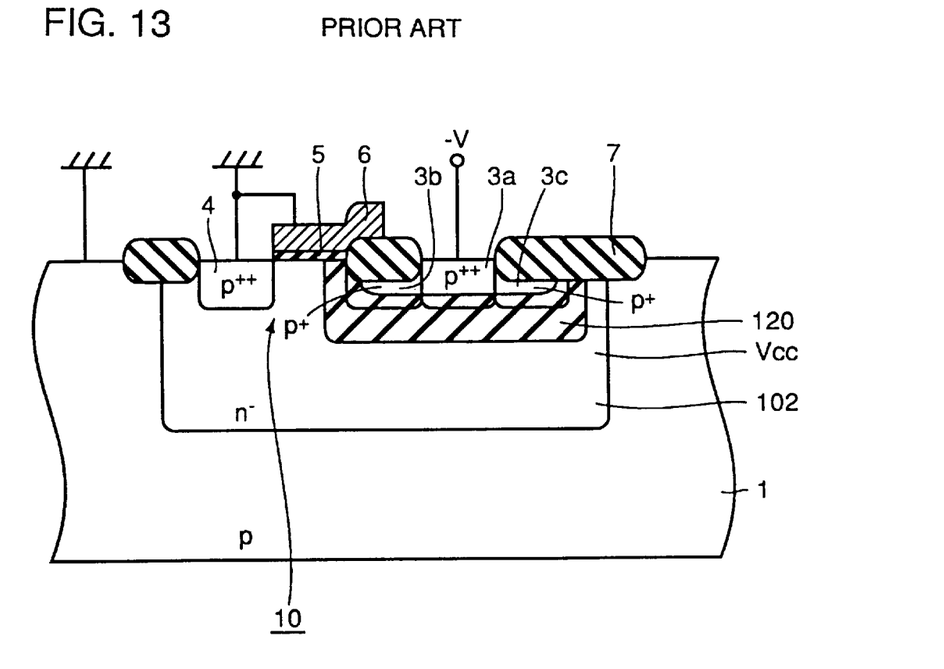
FIGS. 13 and 14 show the spread of a depletion layer in a semiconductor device having a conventional high breakdown voltage MOS transistor.
Figure 14:
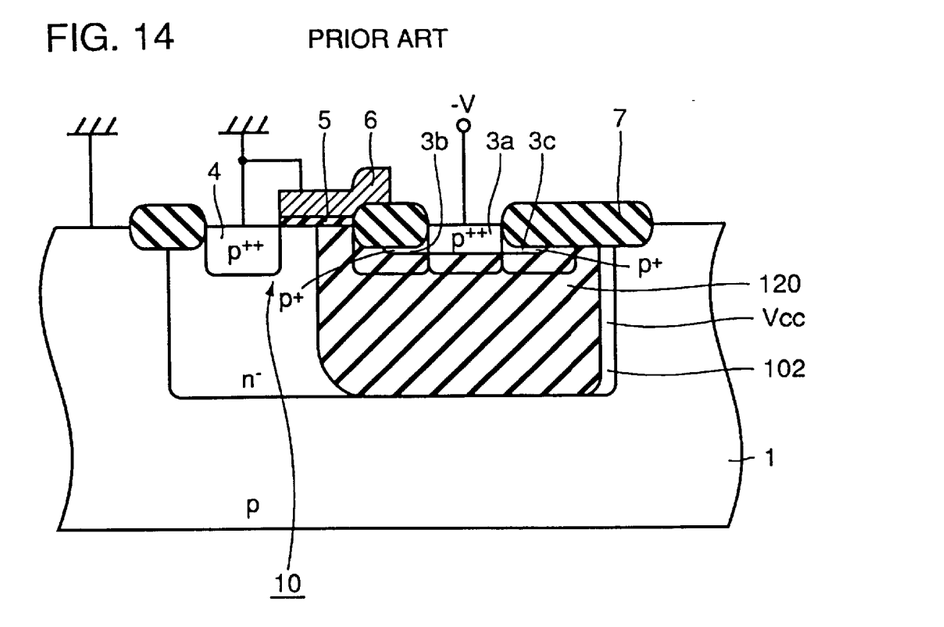

FIGS. 13 and 14 show the spread of a depletion layer generated when a high voltage is applied across the drain of a conventional high breakdown voltage MOS transistor.

Referring to FIG. 13, application of −V to p⁺⁺ region 3a under the state where source region 4, gate electrode layer 6, and p type silicon substrate 1 are at the ground potential causes the spread of depletion layer 120 from the pn junction between the drain region and n⁻ well region 102. As this −V is increased, depletion layer 120 mainly spreads towards the deeper side of the substrate as shown in FIG. 14 to reach the pn junction between n⁻ well region 102 and p type silicon substrate 1. As a result, punch through will occur between the drain region and p type silicon substrate 1. In the conventional case, it was difficult to improve the breakdown voltage since punch through easily occurs when a high voltage is applied across the drain region.

As shown in FIG. 9, n⁻ well region 102 has an impurity concentration peak in the proximity of the substrate surface. Therefore, the impurity concentration gradient at the end portion of drain region 3 in FIG. 8 becomes steeper to result in higher electric field intensity. The breakdown voltage corresponding to avalanche breakdown could not be improved.

SUMMARY OF THE INVENTION

An object of the present invention is to provide a semiconductor device having an insulation gate type field effect transistor that can suppress spread of a depletion layer when high voltage is applied across the drain, that can reduce the electric field intensity at the drain end, and that has superior breakdown voltage.

According to an aspect of the present invention, a semiconductor device having a high breakdown voltage insulation gate type field effect transistor includes a semiconductor substrate of a first conductivity type, an impurity region of a second conductivity type, and an insulation gate type field effect transistor of high breakdown voltage. The semiconductor substrate has a main surface. The impurity region is formed at the main surface of the semiconductor substrate, and has an impurity concentration peak of the second conductivity type. The high breakdown voltage insulation gate field effect transistor includes a drain region of the first conductivity type formed at the main surface located right above the impurity concentration peak.

In the semiconductor device having a high breakdown voltage insulation gate type field effect transistor of the present invention, the impurity region has an impurity concentration peak right below the drain region. Therefore, the spread of the depletion layer from the pn junction of the drain region and the impurity region towards the depth of the substrate when a high voltage is applied across the drain region is suppressed by this impurity concentration peak. The depletion layer does not easily reach the pn junction of the impurity region and the first conductivity type region of the substrate. Accordingly, punch through between the first conductivity type region of the substrate and the drain region does not occur easily. Thus, the breakdown voltage is improved.

In the proximity of the surface of the semiconductor substrate, the impurity concentration of the impurity region is lower than the impurity concentration peak portion. Therefore, the impurity concentration gradient at the drain end of the insulation gate type field effect transistor of high breakdown voltage can be made more gentle to reduce the electric field intensity. Therefore, breakdown voltage corresponding to avalanche breakdown can be improved.

In the above semiconductor device having a high breakdown voltage insulation gate type field effect transistor, the impurity concentration peak is preferably located right below the entire high breakdown voltage insulation gate type field effect transistor.

As a result, generation of punch through between the first conductivity region of the substrate and the drain region is further suppressed to improve the breakdown voltage.

In the above semiconductor device having a high breakdown voltage insulation gate type field effect transistor, the insulation gate type field effect transistor preferably includes a source region of the first conductivity type formed at the main surface, spaced apart and opposite to the drain region. The drain region has a high concentration impurity region of the first conductivity type and a low concentration impurity region adjacent to each other along the main surface. The low concentration impurity region is arranged closer to the source region than the high concentration impurity region. A field isolation insulation layer is formed on the low concentration impurity region. The length of the field isolation insulation layer from the high concentration impurity region side to the source region side is at least 1.0 μm and not more than 3.0 μm.

Since the length of the field isolation insulation layer is defined, the high breakdown voltage insulation gate type field effect transistor can have a breakdown voltage of 50–60 V.

In the above semiconductor device having a high breakdown voltage insulation gate type field effect transistor, the impurity region preferably has a second impurity concentration peak of an impurity concentration lower than the impurity concentration of the first impurity concentration peak, in the proximity of the main surface.

As a result, the impurity concentration of the impurity region in the proximity of the surface of the semiconductor substrate can be controlled independently from the first impurity concentration peak by the second impurity concentration peak. Therefore, the breakdown voltage corresponding to avalanche breakdown can be improved more effectively.

A method of fabricating a semiconductor device having an insulation gate type field effect transistor of high breakdown voltage includes the following steps.

First, second conductivity type impurities are implanted at a first energy and second conductivity type impurities are implanted at a second energy lower than the first energy towards a main surface of a semiconductor substrate of the first conductivity type. Then, a heat treatment is applied to diffuse the implanted impurities, whereby an impurity region of the second conductivity type is formed having a first impurity concentration peak at a predetermined depth from the main surface and a second impurity concentration peak near the main surface. A high breakdown voltage insulation gate type field effect transistor is formed having a drain region of the first conductivity type formed at the main surface right above the impurity concentration peak.

By producing first and second impurity concentration peaks by individual ion implantation in the fabrication method of a semiconductor device having a high breakdown voltage insulation gate field effect transistor of the present invention, the impurity concentration of the first and second impurity concentration peaks can be controlled independently. Therefore, the breakdown voltage when the depletion layer reaches the junction of the semiconductor substrate and the impurity region and the breakdown voltage corresponding to avalanche breakdown can be improved more effectively.

According to the above fabrication method of a semiconductor device having a high breakdown voltage insulation gate type field effect transistor, implantation of the second conductivity type impurities is preferably carried out using the pattern of a silicon oxide film formed at the main surface as a mask.

The application range is increased by using the silicon oxide film as a mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

Figure 1:
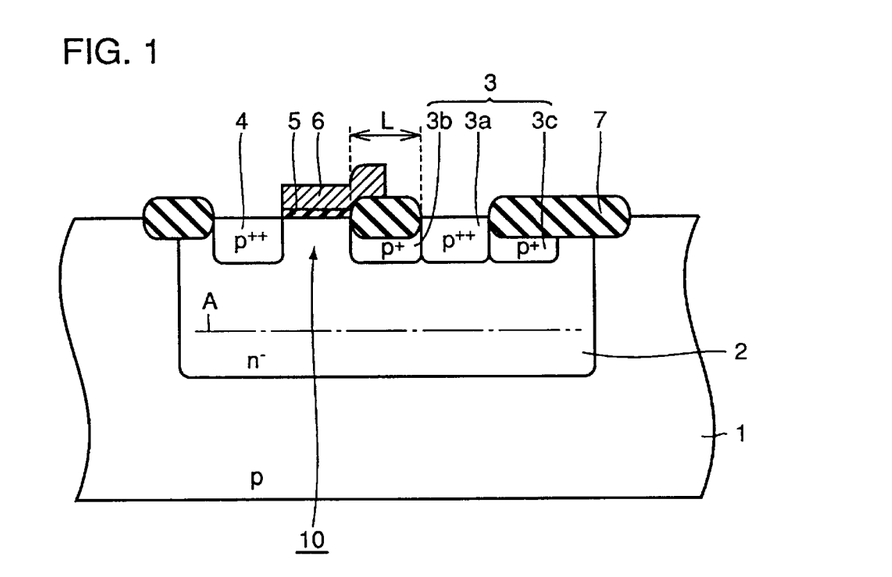
FIG. 1 is a sectional view schematically showing a structure of a semiconductor device having a MOS transistor according to an embodiment of the present invention.

Referring to FIG. 1, an n⁻ well region 2 is selectively formed at a surface of a p type silicon substrate 1 having a B concentration of, for example, $1.0 \times 10^{15}$ (atoms/cm³). A MOS transistor 10 of high breakdown voltage is formed at the surface of n⁻ well region 2.

High breakdown voltage MOS transistor 10 includes a drain region 3, a source region 4, a gate insulation layer 5, and a gate electrode layer 6. Drain region 3 and source region 4 are arranged spaced apart at the surface of silicon substrate 1 in n⁻ well region 2. Drain region 3 includes $p^{++}$ region 3a, $p^{++}$ region 3b located in contact with $p^{++}$ region 3a at the side of source region 4, and a p⁺ region 3c located in contact with $p^{++}$ region 3a at a side opposite to source region 4. Gate electrode layer 6 is formed on the region sandwiched by drain region 3 and source region 4 with a gate insulation layer 5 such as of a silicon oxide film thereunder. Gate electrode layer 6 is formed of polycrystalline silicon doped with impurities, for example.

A field insulation layer 7 such as of silicon oxide film is formed on p⁺ region 3b. One end of gate electrode layer 6 is located extending over gate insulation layer 7. Field insulation layer 7 has a length L of 1.0 μm–3.0 μm, and a thickness of 6000 Å.

Field insulation layer 7 is formed to surround MOS transistor 10 to electrically isolate MOS transistor 10 from other elements.

In the structure of the present embodiment, the impurity concentration distribution of n⁻ well region 2 is to be particularly noted. The impurity concentration distribution of n⁻ well region 2 is shown in FIG. 2.

Figure 2:
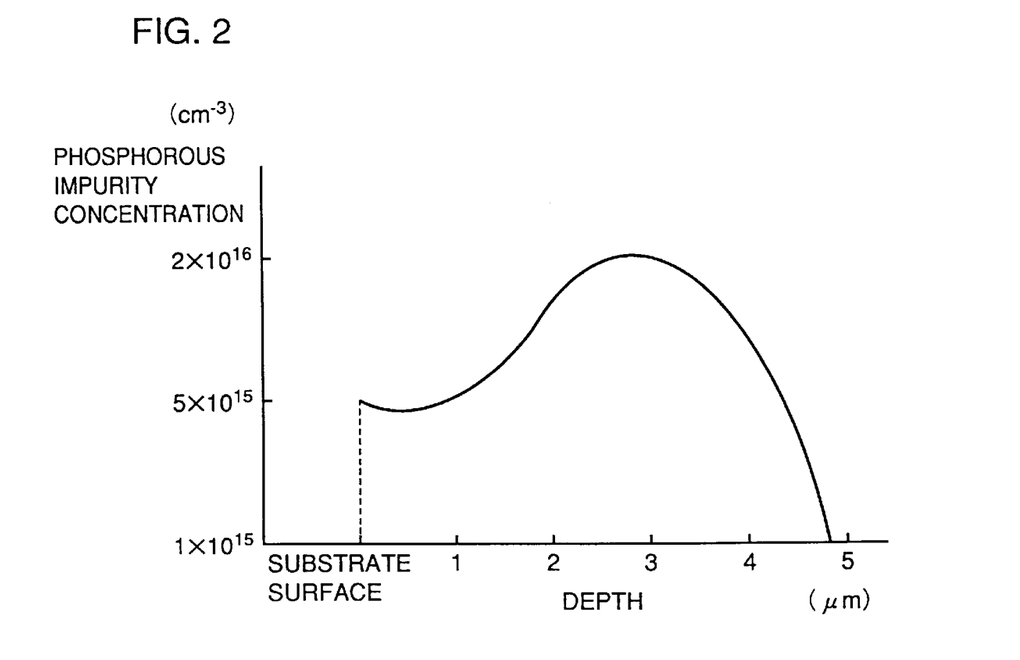
FIG. 2 shows the impurity concentration distribution of an n⁻ well region according to an embodiment of the present invention.

Referring to FIG. 2, the impurity concentration of n⁻ well region 2 of the present embodiment is approximately $5 \times 10^{15}$ (atoms/cm³) in the proximity of the surface of the substrate, which is approximately ¼ the concentration of the conventional case shown in FIG. 9. The concentration peak (chain dotted line A in FIG. 1) of approximately $2 \times 10^{16}$ (atoms/cm³) is seen at the depth of approximately 2.5 μm. The impurity concentration of n⁻ well region 2 shows an abrupt decrease when the depth exceeds 2.5 μm to become $1.0 \times 10^{15}$ (atoms/cm³) at the depth of approximately 5 μm identical to the conventional case shown in FIG. 9. Therefore, a pn junction is formed.

The concentration peak A is located right below the entire MOS transistor 10 of high breakdown voltage.

The n⁻ well region 2 of the present invention having a depth of 5 μm that is substantially equal to that of a conventional case is characterized in that the impurity concentration is approximately ¼ the concentration of a conventional case in the proximity of the substrate surface, and has an impurity concentration peak around the depth of 2.5 μm of a level approximately equal to the surface concentration of the conventional case.

A method of fabricating a semiconductor device of the present embodiment will be described hereinafter.

Figure 3:
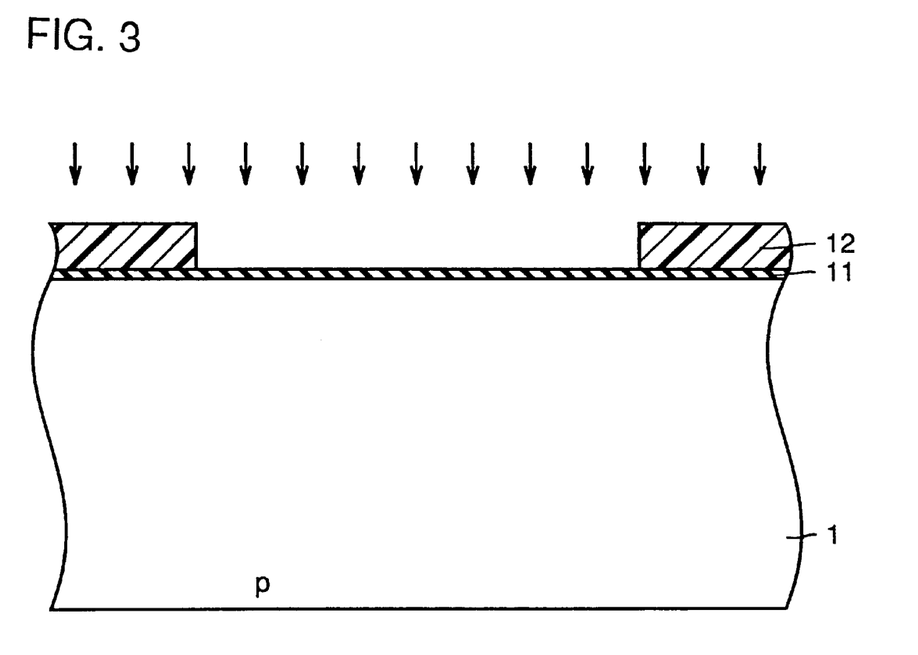
FIGS. 3–5 are sectional views of a semiconductor device having a high breakdown voltage MOS transistor according to an embodiment of the present invention, corresponding to sequential steps of the fabrication process thereof.

Referring to FIG. 3, silicon oxide film 11 is formed at the surface of p type silicon substrate 1. A resist pattern 12 is formed on the surface of silicon oxide film 11 by general photolithographic techniques. Using resist pattern 12 as a mask, P (phosphorous) ions are implanted selectively into p type silicon substrate 1 under the condition of, for example, 3000 (keV) and $3.0 \times 10^{12}$ (cm⁻²). Then, P (phosphorous) ions are implanted selectively under the condition of, for example, 150 (keV) and $2.0 \times 10^{12}$ (cm⁻²) with resist pattern 12 still left as a mask.

Then, resist pattern 12 is removed. A heat treatment is applied at the temperature of 1200° C. and for sixty minutes, for example, to diffuse•activate the P (phosphorous) implanted in p type silicon substrate 1. Then, silicon oxide film 11 is removed.

Figure 4:
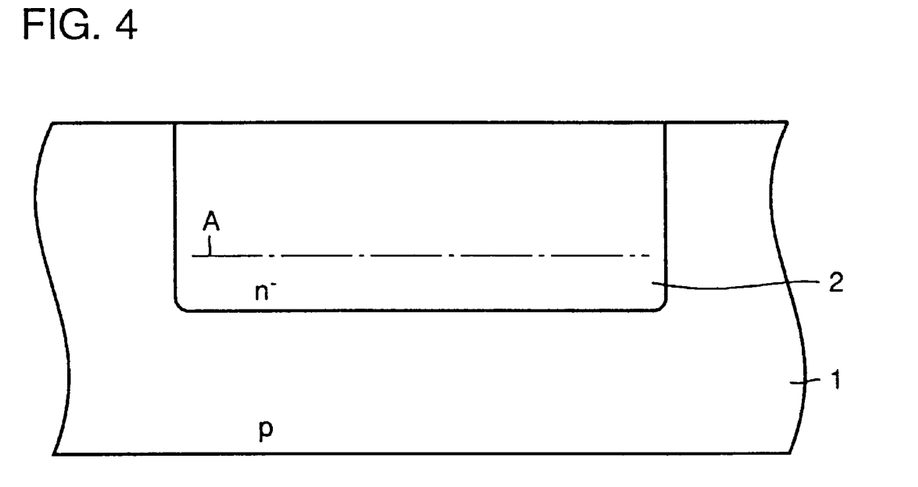

Referring to FIG. 4, n⁻ well region 2 is formed at p type silicon substrate 1, having an impurity concentration peak in the proximity of the substrate surface and an impurity concentration peak A at the depth of approximately 2.5 μm by the two ion-implantation steps.

Figure 5:
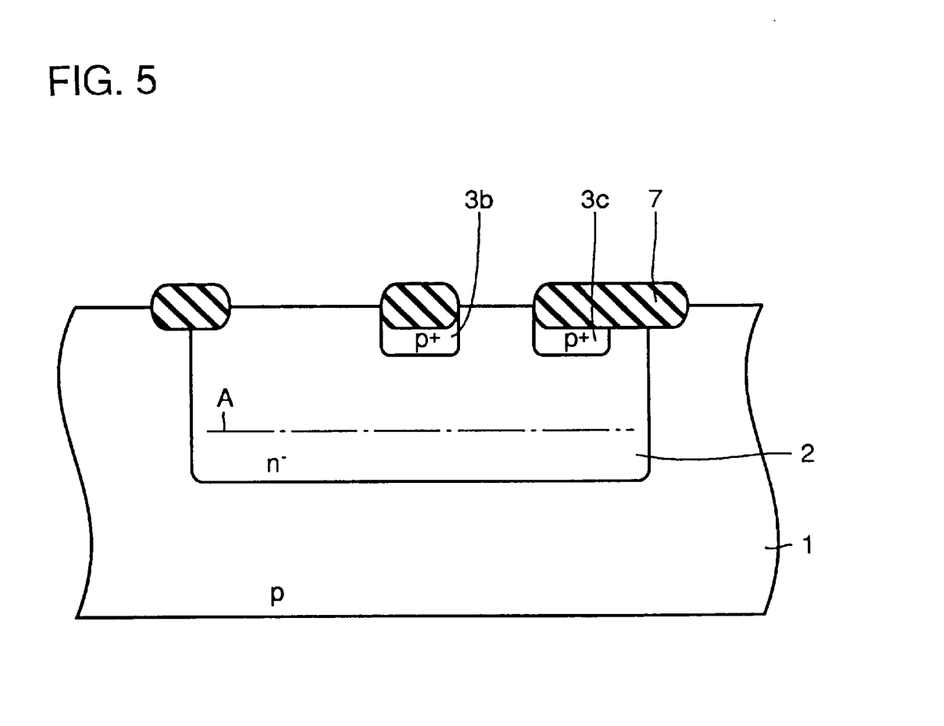

Referring to FIG. 5, field insulation layer 7 is formed at the surface of p type silicon substrate 1. Also, p⁺ regions 3b and 3c are formed below field insulation layer 7. Then, gate insulation layer 5 and gate electrode layer 6 are formed as shown in FIG. 1. Next, $p^{++}$ regions 3a and 4 are formed by ion implantation and the like to complete MOS transistor 10 of high breakdown voltage.

In the semiconductor device of the present embodiment, a high breakdown voltage can easily be achieved. The details will be described hereinafter.

Figure 6:
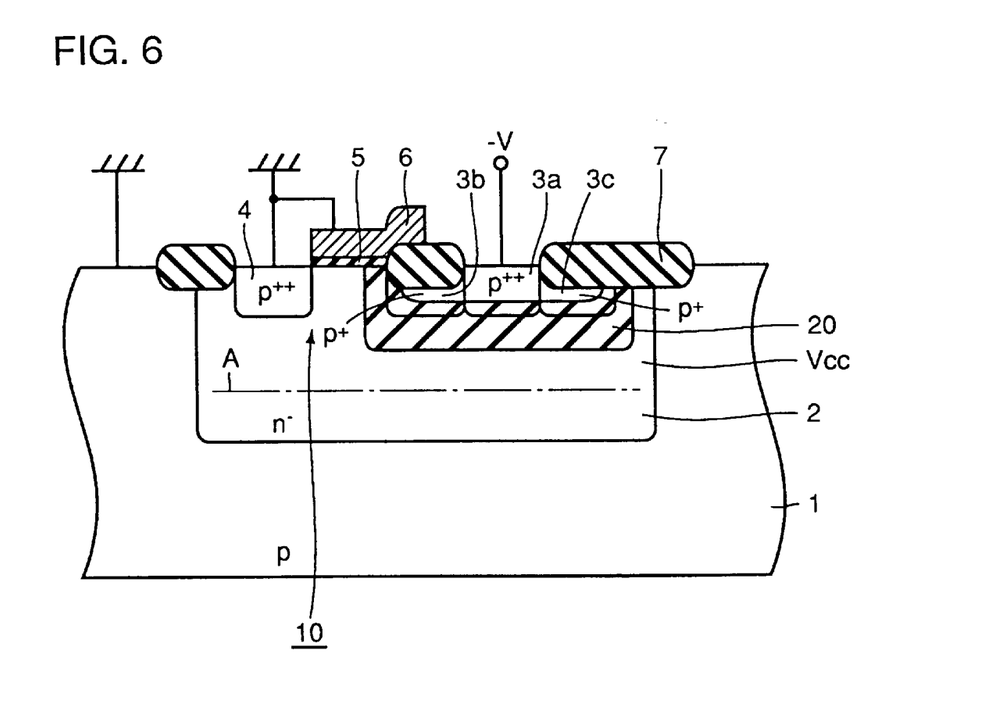
FIGS. 6 and 7 show the spread of a depletion layer in a semiconductor device having a high breakdown voltage MOS transistor according to an embodiment of the present invention.
Figure 7:
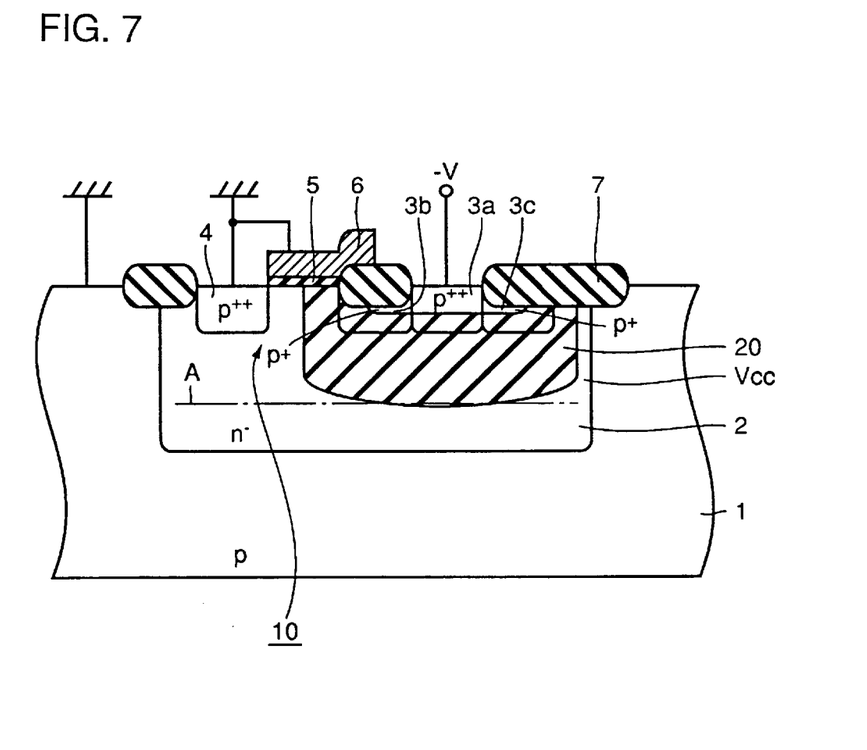

FIGS. 6 and 7 show the spread of the depletion layer when a high voltage is applied across the drain region in the embodiment of the present invention. Referring to FIG. 6, when a negative potential (–V) is applied across the drain region with source region 4, gate electrode layer 6, and p type silicon substrate 1 at the ground potential, the depletion layer mainly spreads deeper into the substrate from the pn junction of the drain region and n⁻ well region 2. Depletion layer 20 penetrates deeper into the substrate as the potential applied to the drain is increased.

However, n⁻ well region 2 has an impurity concentration peak A at a site deeper than the drain region. Therefore, depletion is less effected as the site of impurity concentration peak A is approached to suppress the spread of depletion layer 20. Depletion layer 20 will not easily reach the pn junction of p type silicon substrate 1 and n⁻ well region 2, so that generation of punch through between the drain region and p type silicon substrate 1 is suppressed. Thus, the breakdown voltage is improved.

In the present embodiment, the p type impurity concentration of n⁻ well region 2 in the proximity of the surface of the substrate is as low as approximately ¼ the concentration of the case shown in FIG. 9. Therefore, the p type impurity concentration gradient of drain region 3 at the source region 4 side in FIG. 1 can be made more gentle, so that the electric field intensity of that portion is reduced. Thus, the breakdown voltage corresponding to avalanche breakdown can be improved.

As shown in FIG. 1, impurity concentration peak A of n⁻ well region 2 is present at a predetermined depth of the entire n⁻ well region. Therefore, occurrence of punch through can be further suppressed to improve the breakdown voltage than in the case where the impurity concentration peak is present only beneath drain region 3.

In the fabrication method of the present embodiment, ions are implanted two times according to the processes shown in FIGS. 3 and 4. By forming two individual impurity concentration peaks by two ion-implantation steps, the impurity concentration of the two impurity concentration peaks can be controlled independently. Therefore, the breakdown voltage when the depletion layer reaches the junction of silicon substrate 1 and n⁻ well region 2 and the breakdown voltage corresponding to avalanche breakdown can be improved more effectively.

Although it is desirable to form a deeper n⁻ well region 2 in order to prevent punch through, an n⁻ well region 2 having a depth equal to that of a conventional one can be formed by a heat treatment at a shorter time than that of the conventional case since impurities are implanted deeper than the conventional case.

In the present embodiment, resist pattern 12 is used as a mask in the process of FIG. 3. However, an insulation film such as of silicon oxide film can be used instead of resist pattern 12 as a mask.

The application range of the present semiconductor device can be increased by selecting various types of material for the mask.

The present invention is not limited to a p channel high breakdown voltage MOS transistor described in the present embodiment. The present invention is applicable to an n channel high breakdown voltage MOS transistor with the p and n conductivity types opposite in respective elements to achieve a similar effect.

In the present embodiment, a MOS transistor of high breakdown voltage was mainly described. The present invention is not limited to such a MOS transistor, and is applicable to any insulation gate type field effect transistor of high breakdown voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an insulation gate type field effect transistor of high breakdown voltage, comprising:

a semiconductor substrate of a first conductivity type having a main surface;

an impurity region of a second conductivity type formed on the main surface of said semiconductor substrate, and having an impurity concentration peak of the second conductivity type; and a high breakdown voltage insulation gate type field effect transistor including a drain region of the first conductivity type formed at said main surface located directly above said impurity concentration peak, wherein the impurity concentration in the proximity of said main surface of said impurity region is lower than the impurity concentration of said impurity concentration peak, and there is a region having an impurity concentration lower than said impurity concentration in the proximity of said main surface between said proximity of the main surface and said impurity concentration peak.

2. The semiconductor device having an insulation gate type field effect transistor of high breakdown voltage according to claim 1, wherein said impurity concentration peak is located directly beneath the entirety of said high breakdown voltage insulation gate type field effect transistor.

3. The semiconductor device having an insulation gate type field effect transistor of high breakdown voltage according to claim 1, wherein said high breakdown voltage insulation gate type field effect transistor includes a source region of the first conductivity type formed at said main surface spaced apart from and opposite to said drain region, said drain region has a high concentration impurity region of the first conductivity type and a low concentration impurity region of the first conductivity type adjacent to each other along said main surface, a field isolation insulation layer is formed on said low concentration impurity region, and said field isolation insulation layer has a length of at least 1.0 μm and not more than 3.0 μm from a side of said high concentration impurity region to a side of said source region.

4. A semiconductor device having an insulation gate type field effect transistor of high breakdown voltage, comprising:

a semiconductor substrate of a first conductivity type having a main surface;

a first impurity region of a second conductivity type formed on the main surface of said semiconductor substrate;

a second impurity region of a second conductivity type located deeper than said first impurity region from said main surface, and having an impurity concentration peak at approximately 2.5 microns in depth from said main surface;

said first impurity region and said second impurity region being connected continuously; and a high breakdown voltage insulation gate type field effect transistor including a drain region of the first conductivity type formed at said main surface located right above said impurity concentration peak of said second impurity region.

5. The semiconductor device having an insulation gate type field effect transistor of high breakdown voltage according to claim 4, wherein the impurity concentration in the proximity of said main surface of said first and second impurity regions connected continuously is lower than the impurity concentration of said impurity concentration peak, and there is a region having an impurity concentration lower than said impurity concentration in the proximity of said main surface between said proximity of the main surface and said impurity concentration peak.

* * * * *